United States Patent
Van Ginneken et al.

(10) Patent No.: US 6,505,328 B1
(45) Date of Patent: Jan. 7, 2003

(54) METHOD FOR STORING MULTIPLE LEVELS OF DESIGN DATA IN A COMMON DATABASE

(75) Inventors: Lukas P. P. P. Van Ginneken, San Jose, CA (US); Patrick R. Groeneveld, San Jose, CA (US); Wilhelmus J. M. Philipsen, Phoenix, AZ (US)

(73) Assignee: Magma Design Automation, Inc., Cupertino, CA (US)

( * ) Notice: Subject to any disclaimer, the term of this patent is extended or adjusted under 35 U.S.C. 154(b) by 0 days.

(21) Appl. No.: 09/300,540

(22) Filed: Apr. 27, 1999

(51) Int. Cl.$^7$ ............................................. G06F 17/50
(52) U.S. Cl. ................................. 716/7; 716/8; 716/12
(58) Field of Search ..................................... 716/1–21

(56) References Cited

U.S. PATENT DOCUMENTS

| | | | | |
|---|---|---|---|---|
| 5,187,668 A | * | 2/1993 | Okude et al. ................... | 716/8 |
| 5,212,650 A | * | 5/1993 | Hooper et al. .................. | 716/18 |
| 5,313,615 A | * | 5/1994 | Newman et al. ............... | 716/11 |
| 5,432,707 A | * | 7/1995 | Leung ............................ | 716/2 |
| 5,452,226 A | * | 9/1995 | Hooper et al. .................. | 716/18 |
| 5,487,018 A | * | 1/1996 | Loos et al. ..................... | 716/11 |
| 5,519,627 A | * | 5/1996 | Mahmood et al. ............. | 716/18 |
| 5,541,849 A | * | 7/1996 | Rostoker et al. ............... | 716/18 |
| 5,623,417 A | * | 4/1997 | Iwasaki et al. ................. | 716/18 |
| 5,666,288 A | * | 9/1997 | Jones et al. ..................... | 716/17 |
| 5,696,693 A | * | 12/1997 | Aubel et al. .................... | 716/8 |
| 5,699,265 A | * | 12/1997 | Scepanovic et al. ........... | 716/10 |
| 5,726,902 A | * | 3/1998 | Mahmood et al. ............. | 716/6 |
| 5,727,187 A | * | 3/1998 | Lemche et al. ................. | 716/18 |
| 5,757,657 A | | 5/1998 | Hathaway et al. ............. | 710/9 |
| 5,761,664 A | | 6/1998 | Sayah et al. ................... | 707/100 |
| 5,764,534 A | | 6/1998 | Goetting ........................ | 716/11 |
| 5,818,729 A | * | 10/1998 | Wang et al. .................... | 716/9 |
| 5,841,663 A | * | 11/1998 | Sharma et al. ................. | 716/18 |
| 5,864,487 A | * | 1/1999 | Merryman et al. ............. | 716/6 |
| 5,956,497 A | * | 9/1999 | Ratzel et al. ................... | 716/1 |

(List continued on next page.)

OTHER PUBLICATIONS

Dutt ("Generic component library characterization for high level synthesis", Proceedings of the Fourth CSI/IEEE International Symposium on VLSI Design, 1991, Jan. 4, 1991, pp. 5–10).*

Dion, J. and Monier, L.M.; "Countour: A Title–based Gridless Router," *WRL Research Report 3/95*, Digital Western Research Laboratory.

Dion, J. and Monier, L.M.; "Recursive Layout Generation," *WRL Research Report 2/95*, Digital Western Research Laboratory.

Hwang., J., et al., "Generating layouts for self–emplementing modules"; Intl Workshop on Field Programmable Logic and Applications, FPGAS, GB, Abingdon, Aug. 31, 1998, pp. 525–529.

Singhal, A., et al., "Object oriented data modeling for VLSI/CAD," Proc. of the $8^{th}$ Intl Conf. on VLSI Design, New Delhi, India, Jan. 4–7, 1995, pp. 25–29.

Fcanha, H.S.;, "Data astructtures for physical representation of VLSI," Software Eng'g Journal, GB, IEE. London, vol. 5, No. 6, Nov. 1, 1990.

*Primary Examiner*—Matthew Smith
*Assistant Examiner*—Phallaka Kik
(74) *Attorney, Agent, or Firm*—Pillsbury Winthrop LLP

(57) ABSTRACT

An automated logic circuit design system uses a common database to store design data at different states of the design process, including data-flow graphs, netlists and layout descriptions. In this way, the need to translate circuit descriptions between tools is eliminated, thus leading to increased speed, flexibility and integration. The common database includes entities, models, cells, pins, busses and nets. The data-flow graphs are stored as graphs, the nodes in a graph as cells, and the edges as busses. Physical design data is available by storing the cells in a model in a KD tree. This allows queries on cells in the netlist located in the layout within arbitrary areas.

17 Claims, 4 Drawing Sheets

U.S. PATENT DOCUMENTS

| | | | |
|---|---|---|---|
| 5,960,184 A | * 9/1999 | Cleereman et al. | 716/3 |
| 6,026,228 A | * 2/2000 | Imai et al. | 716/188 |
| 6,080,201 A | * 6/2000 | Hojat et al. | 703/14 |
| 6,145,117 A | * 11/2000 | Eng | 716/18 |
| 6,154,874 A | * 11/2000 | Scepanovic et al. | 716/13 |
| 6,216,258 B1 | * 4/2001 | Mohan et al. | 716/17 |
| 6,263,483 B1 | * 7/2001 | Dupenloup | 716/18 |
| 6,289,489 B1 | * 9/2001 | Bold et al. | 716/1 |
| 6,308,309 B1 | * 10/2001 | Gan et al. | 716/8 |

* cited by examiner

METHOD FOR STORING MULTIPLE LEVELS OF DESIGN DATA IN A COMMON DATABASE

BACKGROUND OF THE INVENTION

1. Field of the Invention

The present invention is directed to digital logic design systems. More particularly, the invention is directed to automated digital logic synthesis and placement systems.

2. Background of the Related Art

Prior art computer aided design (CAD) systems for the design of integrated circuits and the like assist in the design thereof by providing a user with a set of software tools running on a computer. In the prior art, the process of designing an integrated circuit on a typical CAD system was done in several discrete steps using different software tools.

First, a schematic diagram of the integrated circuit is entered interactively to produce a digital representation of the integrated circuit elements and their interconnections. This representation may initially be in a hardware description language such as Verilog and then translated into a register transfer level (RTL) description in terms of pre-designed functional blocks, such as memories and registers. This may take the form of a data structure called a net list.

Next, a logic compiler receives the net list and, using a component database, puts all of the information necessary for layout, verification and simulation into object files whose formats are optimized specifically for those functions.

Afterwards, a logic verifier checks the schematic for design errors, such as multiple outputs connected together, overloaded signal paths, etc., and generates error indications if any such design problems exist. In many cases, the IC designer improperly connected or improperly placed a physical item within one or more cells. In this case, these errors are flagged to the IC designer so that the layout cells may be fixed so that the layout cells perform their proper logical operation. Also, the verification process checks the hand-laid-out cells to determine if a plurality of design rules have been observed. Design rules are provided to integrated circuit designers to ensure that a part can be manufactured with greater yield. Most design rules include hundreds of parameters and, for example, include pitch between metal lines, spacing between diffusion regions in the substrate, sizes of conductive regions to ensure proper contacting without electrical short circuiting, minimum widths of conductive regions, pad sizes, and the like. If a design rule violation is identified, this violation is flagged to the IC designer so that the IC designer can properly correct the cells so that the cells are in accordance with the design rules.

Then, using a simulator the user of the CAD system prepares a list of vectors representing real input values to be applied to the simulation model of the integrated circuit. This representation is translated into a form which is best suited to simulation. This representation of the integrated circuit is then operated upon by the simulator which produces numerical outputs analogous to the response of a real circuit with the same inputs applied. By viewing the simulation results, the user may then determine if the represented circuit will perform correctly when it is constructed. If not, he or she may re-edit the schematic of the integrated circuit, re-compile and re-simulate. This process is performed iteratively until the user is satisfied that the design of the integrated circuit is correct.

Then, the human IC designer presents as input to a logic synthesis tool a cell library and a behavioral model. The behavioral circuit model is typically a file in memory which looks very similar to a computer program. The behavioral circuit model contains instructions which define logically the operation of the integrated circuit. The logic synthesis tool receives as input the instructions from the RTL circuit model (i.e., Verilog or VHDL) and the library cells from the library. The synthesis tool maps the instructions from the behavioral circuit model to one or more logic cells from the library to transform the behavioral circuit model to a gate schematic net list of interconnected cells. A gate schematic net list is a data base having interconnected logic cells which perform a logical function in accordance with the behavioral circuit model instructions. Once the gate schematic net list is formed, it is provided to a place and route tool.

The place and route tool is used to access the gate schematic net list and the library cells to position the cells of the gate schematic net list in a two-dimensional format within a surface area of an integrated circuit die perimeter. The output of the place and route step is a two-dimensional physical design file which indicates the layout interconnection and two-dimensional IC physical arrangements of all gates/cells within the gate schematic net list.

According to the above prior art method, a separate internal data structure is used for each tool. This is because the tools are rarely if ever written by the same group; thus, the internal database representation for each tools is likely to differ from that of the other tools. Also, the most appropriate database implementation for the integrated circuit depends on the phase of the design process in which it is being used. For example, linked lists are commonly used to store cells in a netlist because that is the most obvious solution for logic synthesis purposes. In contrast, a KD tree is a more appropriate database format for the place and route tool.

This is time-consuming and processor-intensive (circuit specifications must be translated from one database format to another and another during the development process), disk-intensive (multiple databases each specifying the same circuit in different forms must be stored) and fragmented (tools cannot use the outputs of other tools, and a change to the circuit made by one tool is not reflected in the databases of the other tools).

SUMMARY OF THE INVENTION

The present invention has been made with the above problems of the prior art in mind, and a first object of the present invention is to provide a system for automated logic circuit design which is capable of storing and utilizing multiple levels of design data in a common database.

Another object of the present invention is to provide a system for automated logic circuit design which eliminates the need for translation of circuit descriptions between different design tools.

A further object of the present invention is to provide a system for automated logic circuit design which allows the output of tools in the design suite to be used by other tools.

Yet another object of the present invention is to provide a system for automated logic circuit design which allows design tools or the user to make area queries, i.e., a selection of a subset of objects based on their physical position, at various stages in the design process.

A still further object of the present invention is to provide a system for automated logic circuit design which permits the use of global simulation tools such as timing engines across all levels of design abstraction.

Another object of the present invention is to provide a system for automated logic circuit design which presents a unified model for timing, synthesis, placement and routing.

A further object of the present invention is to provide a system for automated logic circuit design which has high storage and run-time efficiency.

A still further object of the present invention is to provide a system for automated logic circuit design which has a consistent and easy to use programming interface.

A still further object of the present invention is to provide a system for automated logic circuit design which has an interface which is not dependent on other include files.

A further object of the present invention is to provide a system for automated logic circuit design which uses an object-oriented C++ programming style.

The above objects are achieved according to an aspect of the invention by providing an automated logic circuit design system which uses a common database to store design data at different states of the design process, including data-flow graphs, netlists and layout descriptions. In this way, the need to translate circuit descriptions between tools is eliminated, thus leading to increased speed, flexibility and integration. The common database includes entities, models, cells, pins, busses and nets. The data-flow graphs are stored as graphs, the nodes in a graph as cells, and the edges as busses. Physical design data is available by storing the cells in a model in a KD tree. This allows queries on cells in the netlist located in the layout within arbitrary areas.

BRIEF DESCRIPTION OF THE DRAWINGS

These and other objects, features, and advantages of the present invention are better understood by reading the following detailed description of the preferred embodiment, taken in conjunction with the accompanying drawings, in which.

DETAILED DESCRIPTION OF THE PRESENTLY PREFERRED EXEMPLARY EMBODIMENT

First, given a Verilog description of a circuit to be developed, the Verilog must be parsed to generate a data flow graph suitable for implementation in the data model. RTL parsers known in the art are preferably used for this purpose. The output from the RTL parser is a Verilog parse tree which is used to generate the data flow graph. Although well-known in the art, the structure of the parse tree is relatively complicated and, since detailed knowledge of it is not necessary for an understanding of the present invention, further description of the parse tree will be omitted for simplicity and brevity.

Figure 1:
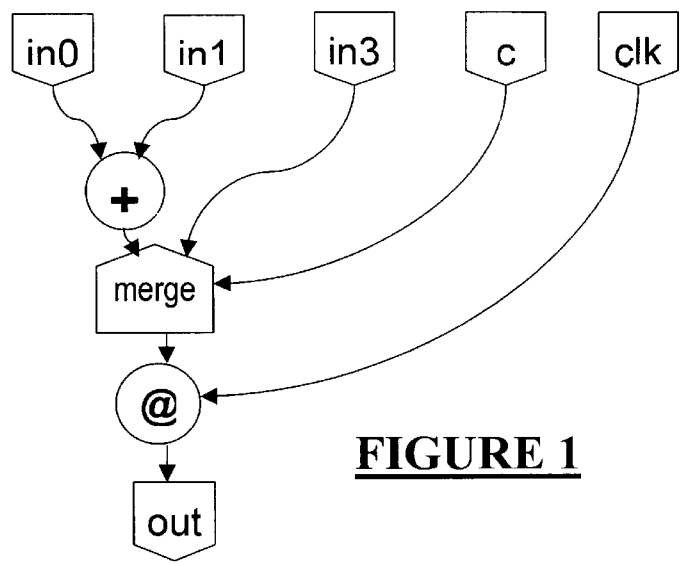
FIGS. 1–3 are dataflow diagrams of a circuit structure according to a preferred embodiment of the present invention.

FIG. 1 shows an example of translation of the Verilog source code

```
always @(posedge clk)
begin
  out=in1+in2;
  if (c)
    out=in3;
end
``` into data flow elements. Here, in0, in1, in2, c and clk are input ports of an Entity (described below) and out is an output port of the Entity. An adder (an example of a Cell as described bellow) adds the values at Ports in0 and in1 and supplies the result to a merge block (another example of a Cell). If the value at Port c represents a logical true, the merge block supplies the value at Port in2 to a delay block (again, a Cell); if the value at Port c represents a logical false, the merge block supplies the output of the adder to the delay block. On the positive-going edge of the signal at Port clk, the delay block provides the value on its input to the output port out. The data flow graph having been generated, it may then be stored in the data model.

Figure 2:
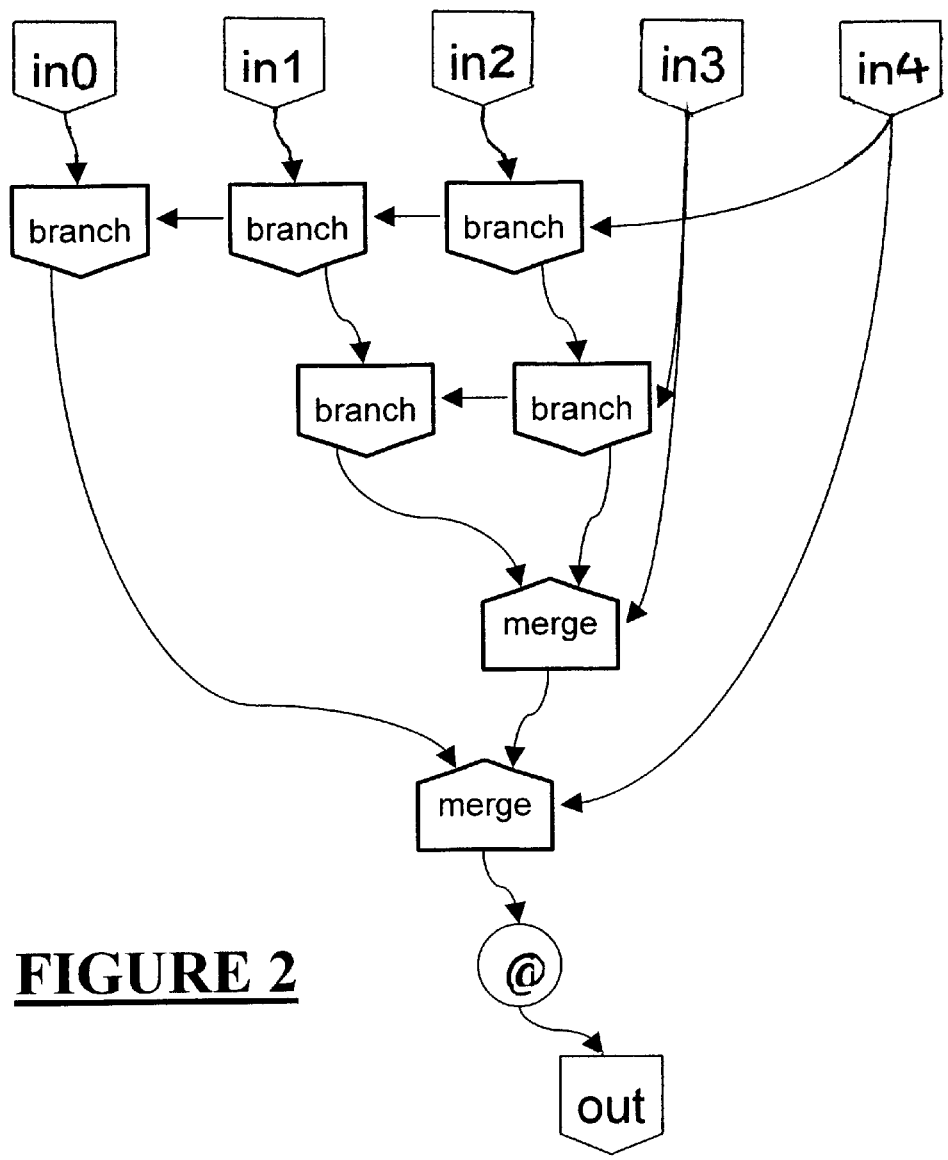

Before describing the data model in more detail, a few more examples are in order. FIG. 2 shows an example of the data graph resulting from the Verilog code

```
if (c1) begin
  out=in0;
end else begin
  if (c2) begin
    out=in1
  end else begin
    out=in2
  end
end
```

Here, if the value at input Port c1 is a logical true, the branch module connected to input Port in0 is enabled and provides its output to a merge module which is also enabled when c1 is true. If c1 is not true, the branch modules connected to Ports in1 and in2 are enabled to provide their outputs to other branch modules. One of the modules in this second tier is enabled when the value at input Port c2 is true and provides its output to another merge block. The other of the modules in the second tier is enabled when c2 is false and provides its output to the other merge block. Depending on the value of c2, one of those outputs is provided to the first merge block, and depending on the value of c1, one of the output is provided to the output port out via the delay element.

Figure 3:
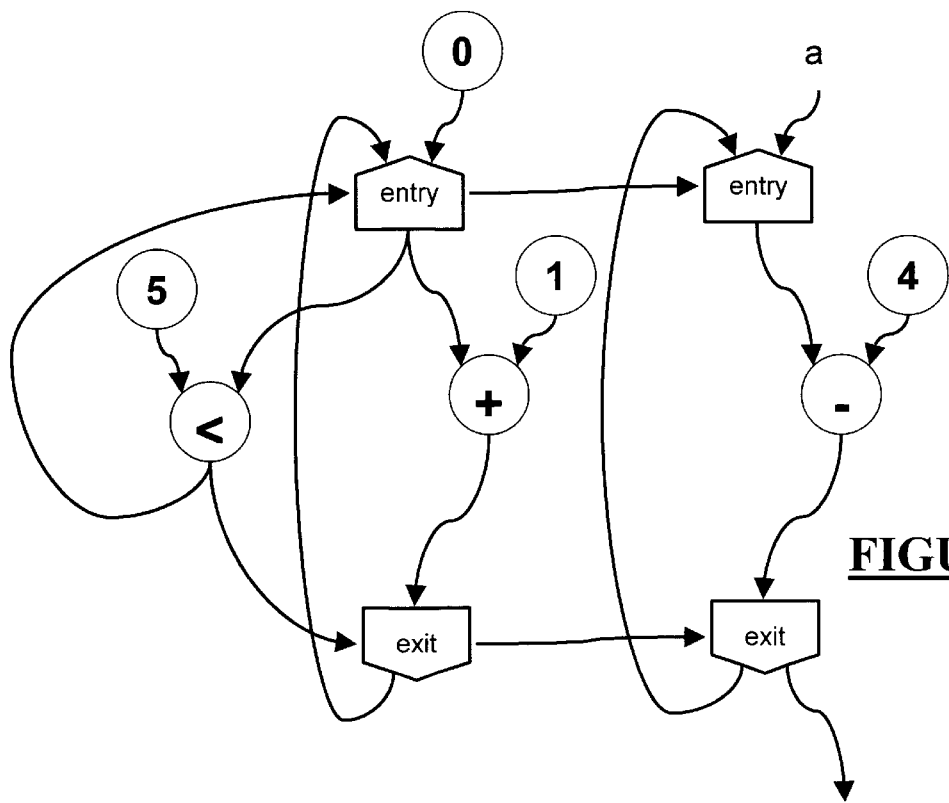

Finally, repetitive structures such as for, while and forever loops can be implemented in the data flow graph. FIG. 3 shows an example of the data flow graph implementation of the Verilog code

```
integer i;
for (i=0; i<5; i++)
begin
  a=a-4
end
```

Here, an entry node initializes a loop index with the value 0, adds 1 to the index and checks to see if the index is less than 5. If so, an exit node loops back for another pass. In tandem with this loop, an input variable a is received through another entry node and 4 is subtracted from it on each pass through the loop. When looping ceases because the index has reached 5, the current value of the input variable is presented at the exit node.

Certain optimizations can be performed on the data flow graph. For example, in the above loop structure the loop can be unrolled. That is, the graph portion representing the body of the loop can be replicated five times and the graph portion representing the loop index can be eliminated. For timing estimations and the like, virtual loop unrolling can be performed by estimating the number of iterations through the loop and using that number as a multiplier in delay calculations; the actual circuit replications can be done later.

Once the Verilog source is converted to a data flow graph, it can be implemented in the data model. Preferably, the data model is implemented using the C++ programming language or a similar object-oriented language. Since the construction, accessing and destruction of objects in such languages is well-known in the art, examples of specific commands for performing these operations will be omitted for brevity.

Figure 4:
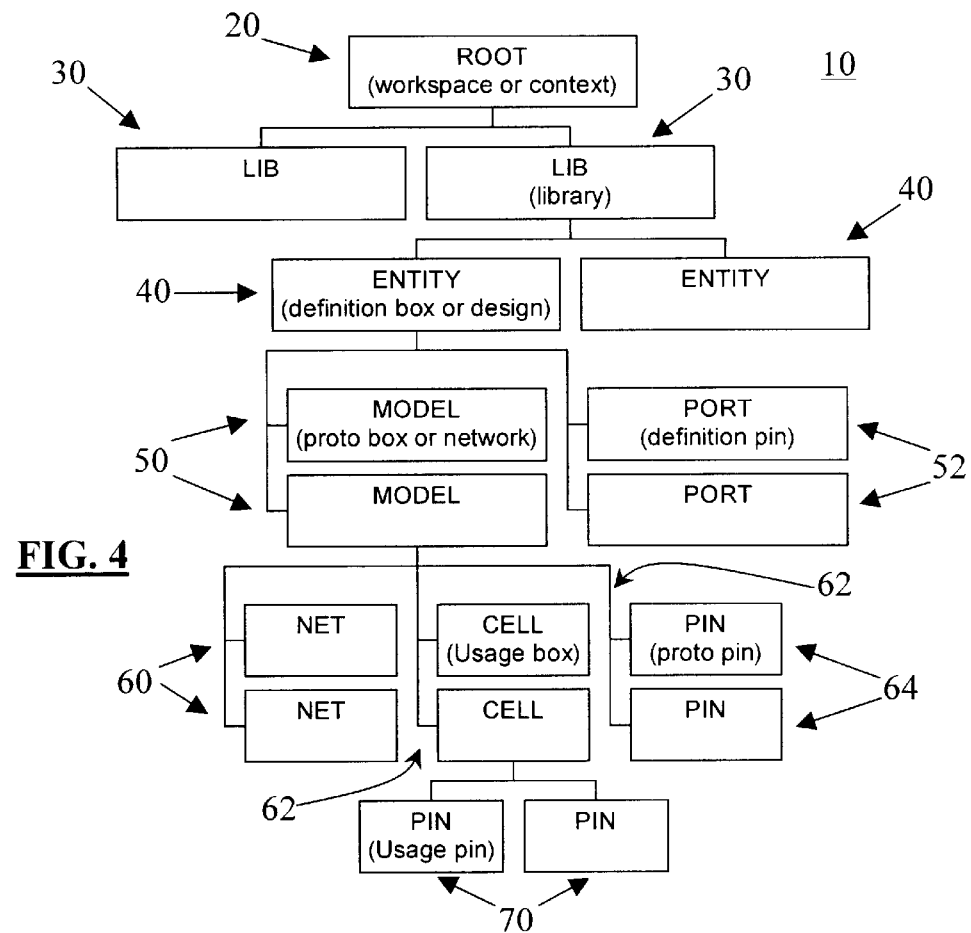
FIG. 4 is a block diagram of the structure of a data model according to the present invention.

The topmost object in the data model 10 (shown in FIG. 4) is the Root object 20. The Root object 20 owns all other objects 30–70 and serves as a base to which everything else is attached. Also, the root 20 accommodates global attributes which are shared by all objects 20–70.

At the next level of the data model 10 is the Library object 30. Library objects 30 are used to organize entities 40. The preferred embodiment of the present invention includes at least two Libraries 30. The first stores information on the technology library to which the circuit under development will be mapped, and the second stores information on the circuit itself.

Next is the Entity object 40. An Entity 40 defines the interface of a design; that is, the set of ports 52 that the Entity 40 has. An Entity 40 may own Port objects 52. A Port 52 is used to represent the pin-out of an entity 40. Ports 52 cannot be individually created and destroyed, and can only be created when an Entity 40 is created. Each Port 52 has a direction (in, out, in/out) which is determined upon creation of the Entity 40. This rigidity promotes consistency between the Entity 40, its Models 50 and the Cells 62 bound to those Models 50.

As noted above, Entities 40 own Models 50. A Model 50 defines an implementation of an Entity 40; thus, multiple Models 50 within an Entity 40 represent different implementations of that Entity 40. Generally, these Models 50 are functionally identical to one another. For example, an Entity 40 in a technology Library 30 may have several Models 50 defining various eight bit adder cells having different power levels. Similarly, an Entity 40 in a target Library 30 may have several Models 50 which respectively define an abstract logic representation of a circuit, a gate-level implementation of it, a uniquefied representation, etc. The contents of each Model 50 is a net list of Nets 60, Cells 62 and Model Pins 64. All Models 50 and the Entity 40 have the same number of Pins 64 and Ports 52, and the Ports 52 have the same direction in the Entity 40 and over all Models 50; thus, it is relatively easy to replace one Model 50 with another from the same Entity 40.

Below the Models 50 are Cell objects 62. A Cell 62 represents a section of logic. Cells 62 may be primitive cells or non-primitive cells. Primitive Cells 62 have a predefined functionality associated with them. Preferably, the primitive Cells 62 include the following types:

CELL_AND—unlimited fan-in AND gate;
  CELL_XOR—unlimited fan-in OR gate;
  CELL_TRI—tri-state buffer
  CELL_REG—sequential element
  CELL_DC—don't care set
  CELL_BREAK—break point cell; used to implement a "don't touch"; and
  CELL_ONE—a constant one; an inverted or bubbled version is used for a constant zero.

In contrast to primitive Cells, the functionality of non-primitive Cells is defined by technology Models 50 to which they are bound. That is, a Cell 62 may describe a portion of the circuit under development and belong to a Model 50 in a target Library 30. However, it will be associated with (preferably by pointing through a cell type attribute or the like) a Model 50 in a technology library 30 which defines its functionality and general characteristics.

Non-primitive Cells 62 may be created as bound Cells; alternatively, they may be created as unbound Cells and later bound to a Model 50. This may be done by specifying the Cell's name; by specifying pin-to-pin correspondence vectors; and by binding the Cell 62 to an undefined Model 50 and later matching the Model 50 to an actual one. Additionally, a bound Cell 62 can be rebound to a different Model 50 within the same Entity 40.

Each Cell 62 includes a number of parameters called members which specify certain features of the Cell 62. These include the cell's name, a pointer to the technology Model 50 to which it is bound, a list of Pins 64 which it owns, its parent Entity 40, and coordinates of the Cell 62 within the chip layout.

Net objects 60 make connections between pins. The pins may be Model pins 64 or Cell pins 70. A Net 60 does not own Pins 64 and 70, and deleting the Net 60 will leave the pins 64 and 70 disconnected. Pins 64 and 70 may be grouped into Busses 80 (in fact, every variable in the Verilog code will be represented as a Bus). Since Pins 64 and 70 are the most common object in almost any circuit representation, it is important to reduce the amount of storage for each Pin 64 and 70 as much as possible while maintaining easy accessibility. For this reason, Pins 64 and 70 are preferably stored in small arrays and associated with indices.

Nets 60 also have members, such as the Net's name, a list of Pins 64 and 70 which it connects, and a list of rectangles through which it passes in the placement layout. Pin members include the Pin's name, the Model 50 or Cell 62 to which it belongs, and the Net 60 to which it is connected.

Each object 20–70 may have a number of attributes. Each attribute has a name and a value of a type int, short, float, double, char* and void*. One example of an object attribute is an inversion attribute or "bubble" which specifies whether a Cell input or output (or Net 60) is asserted high or low. Other examples of object attributes are object name, firing information, references to the Verilog code defining the object, etc.

Iterators are procedures used to access objects within the data model. As is known in the art, an iterator traverses the model and each time it is called, returns a pointer to the next object of a particular type. For example, a Model iterator would, when successively called, return pointers to each Model 50 within the data model. The preferred embodiment of the present invention provides "safe" and "unsafe" iterators, where unsafe iterators return all objects of the specified type, even if they have been added during the iteration process, and safe iterators omit objects added during the iteration. In this way, although the safe iterators are slightly slower than their unsafe counterparts, they can avoid program crashes, errors and exceptions, and other undesirable outcomes.

Before synthesis and timing can take place it is often necessary to uniquefy the data model. This involves binding each Cell 62 to its own individual technology Model 50. This simplifies the synthesis process in that changes made to one technology Model 50 will affect only the Cell 62 which is bound to it, and no others. Also, after uniquefication it is possible to traverse the data model both up and down, since each object has a unique parent and child. Typically, uniquefication is done by making a copy of a technology Model 50 for each Cell 62 which is bound to it and associating one of the cells 62 to each copy.

After the data model has been uniquefied, it may be ungrouped, i.e., macro-level cells can be replaced with their primitive components. Alternatively, processes may handle the data model with virtual ungrouping by "looking through" the macro-level cells to process their primitive cell constituents.

With this understanding of the structure of the data model in mind, implementation of a Verilog-derived data flow graph in the data model will now be described. For each module in the Verilog description there will be one Entity 40 and one Model 50 (hereinafter collectively referred to as a graph). The ports for the Entity 40 correspond to the ports in the Verilog module. Ports 52 in the graph have a bit width, and there will be a separate Pin 64 and Net 60 (the group of Nets 60 for the Port 52 forming a Bus) in the graph for each Verilog port.

For each node in the Verilog module, a Cell 62 will be made in the graph. Initially the Cells 62 will be unbound. As described above, given the Cell type and the Pins 70 of the Cell 62, a Model 50 for the Cell 62 to be bound can be generated later.

Figure 5:
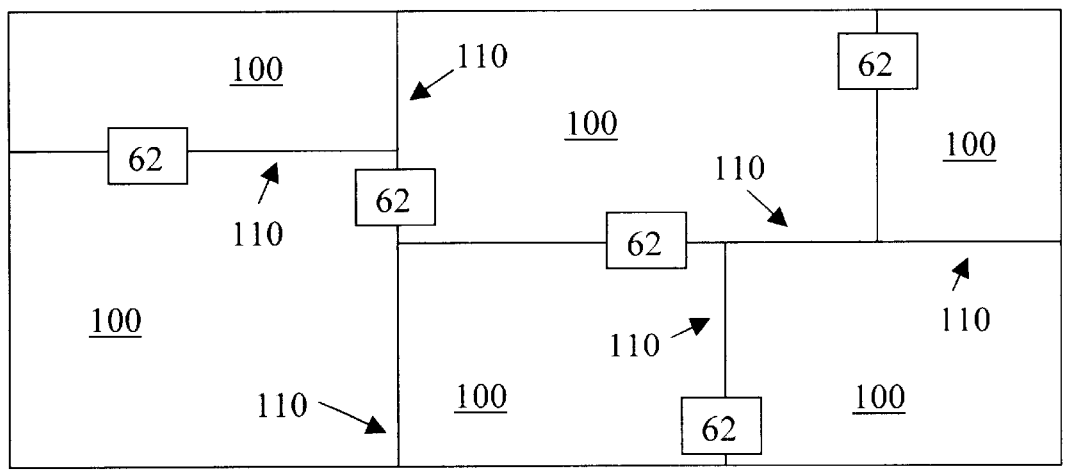
FIGS. 5 and 6 are diagrams of the partitioning of a chip in correspondence with the data model.
Figure 6:
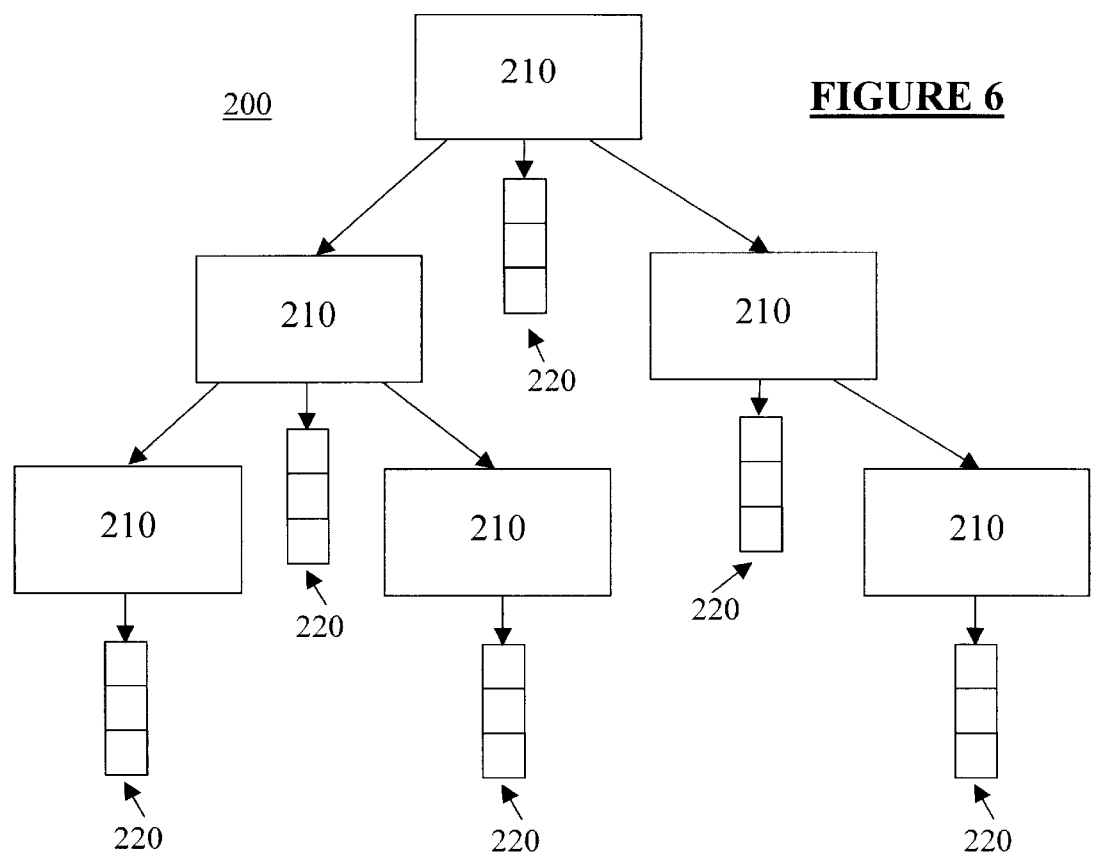

Each Model 50 is preferably implemented as a KD tree as follows. First, the circuit under development is divided into a number of sections each corresponding to a rectangular section 100 of the available chip area as shown in FIG. 5. The partitioning of the circuit can be directed by the user; however, it is preferably automatically done by the system so that the circuit is evenly distributed over the entire chip area. Each node or leaf 210 of the KD tree 200 shown in FIG. 6 corresponds to a cutline 110 of the rectangles 100 and may have appended thereto a linked list 220 of all cells 62 which lie on that cutline 110. Non-leaf nodes 210 in the KD tree 200 each have two child nodes 210, with the left child 210 corresponding to the region of the chip on one side of the cutline 110 and the right child 210 corresponding to the region of the chip on the other side of the cutline 110. Similarly, the child nodes 210 may have linked lists 220 of cells on their cutlines 110 and child nodes 210 of their own.

It should be noted that the leaf nodes 210 will contain most of the circuit information, since the non-leaf nodes 210 will only have information on those cells touching their corresponding cutline.

As noted above, the initial distribution of Cells 62 over the chip area is preferably done automatically by the system and in that case may be done through the use of various algorithms which will readily suggest themselves to those skilled in the art. The result of this process is a model with mostly logical information on its constituent elements but with a coarse framework of physical placement and routing information, e.g., cell areas, initial placements, etc. In later steps of the development process described below, the physical information will be refined and augmented within the original data model. In this way, the addition of rough physical layout information to the initial logical description enables the smooth transition of the circuit through the development process, thereby enabling sharing of tool outputs, use of common diagnostics and the like.

Further, once RTL synthesis is complete and the data model is flattened, it may be copied and used as a baseline for formal verification and the like. Since a common model structure is used, there is no need to translate the pre-logic synthesis version of the circuit into a format suitable for use by the verification tool.

As the development process progresses, the KD tree 200 may become unbalanced due to an excessive number of additions or deletions in one area, or due to poor initial distribution. This can be compensated for by manual rebalancing by the user or by a user-initiated procedure, but preferably is done automatically by the system.

Once the data model has been constructed in this way, it may be used for both logic synthesis, i.e., gate-level implementation, etc., and physical synthesis, i.e., placing and routing. This is because the data model includes all of the information necessary for logical synthesis operations, i.e., cell functionality, net connections, etc., as well as all information necessary for physical synthesis operations, i.e., areas, physical positions, etc.

Another advantage of the data model arises from its correspondence with the actual physical chip layout. Since each node of the KD tree 200 corresponds to a cutline 110 and has associated with it the cells on the cutline and information on where its child nodes are within the chip area, portions of the circuit in specific physical areas can be queried, tested and manipulated without the need to read the entire data model into active memory from disk storage, as is the case with prior art net lists. For example, assuming a user wanted to work with only the lower right hand corner of the chip, the system could traverse the KD tree to reach the topmost node corresponding to that area. Then, that node, its children, netlists and the like would be read into active memory from disk and manipulated. The user may even be able to manually direct placement of cutlines 110 at certain points to frame a particular area of interest. The system may then adjust the KD tree accordingly to accommodate the new arrangement. This area query technique is possible whether the circuit is in its final placement and routing stages or fresh from Verilog synthesis.

Although only a portion of the entire data model need be read into memory, the complete set of Nets 60 is typically maintained in memory. This is because the Nets 60 are necessary for purposes such as delay estimation and the like that are performed frequently, and it is easier to retain all Nets 60 in memory rather than repeatedly read them into memory. Thus, once a specific area has been designated for querying, the Nets 60 corresponding to that area must be identified. This is done by identifying the Nets 60 connected to each of the Pins 64, 70 within the selected area. The remaining Nets 60 can be eliminated from consideration during the area query. Nets 60 which have some, but not all, Pins 64, 70 within the query area can have the missing pins represented by a stub pin. Finally, Nets 60 which have all of their pins within the query area can be handled as are other objects within the selected area.

Further, during the area query process, Nets 60 which are entirely contained within the selected area can be optimized out or otherwise modified; however those nets having portions outside the query area, i.e., those with stub pins, cannot, since the effect of modification of elimination of these Nets 60 on the remaining circuit portions is unpredictable.

Further, since the logical and physical aspects of the circuit are integrated into a single data model from the start, deviations from the classic logical synthesis/physical synthesis partition can be made. For example, the inclusion of buffers for load handling and timing purposes is normally done as part of the logical synthesis process; however, using a common data model for all aspects of the development process allows the placement of buffers to be delayed until later during the placement process, when layout information is more definite and precise. The above description of the preferred embodiment of the present invention has been given for purposes of illustration only, and variations thereof will be readily apparent to those skilled in the art. For example, although Verilog has been used as the preferred language for initial input of the circuit under development, other appropriate hardware description languages may of course be used. Also, although implementation of the data model using object-oriented C++ techniques has been disclosed, other programming languages and paradigms may also be workable. Similarly, alternative object hierarchies may be used. Such variations fall within the scope of the present invention. Thus, the scope of the present invention should be limited only by the appended claims.

What is claimed is:

1. A common data model representing a circuit that will be fabricated on an integrated circuit chip comprising:

a data representation including a plurality of objects that together represent the circuit, certain ones of the objects including a netlist portion that represents a corresponding portion of the circuit, and each of the objects:

being logically correlated to at least one other object so that all of the objects describe the circuit; and each of the objects, once associated with a physical location is adapted for subsequent retrieval using an area query corresponding to the physical location.

2. The model according to claim 1 wherein the physical location association of objects is implemented using hierarchical partitioning.

3. The model according to claim 2 wherein the bierarchical partitioning is implemented using a tree.

4. The model according to claim 3 wherein the circuit is represented within an area, with a plurality of cutlines that partition the area into a plurality of rectagles.

5. The model according to claim 4 wherein the tree contains a plurality of leaf nodes, and each of the leaf nodes corresponds to one of the cutlines.

6. The model according to claim 5 wherein the tree includes a linked list that identifies each cell that lies on a particular one of the cutlines.

7. The model according to claim 5 wherein the tree contains a plurality of non-leaf nodes, each of the non-leaf nodes associated with one of the leaf nodes, and each of the non-leaf nodes, containing at least two child nodes, each child node corresponding to an area on an opposite side of the cutline associated with the one leaf node.

8. The model according to claim 3 wherein certain of the objects represent cells.

9. The model according to claim 3 wherein certain of the objects represent a net or a part of a net.

10. The model according to claim 3 wherein certain of the objects represent pins.

11. The model according to claim 1 wherein the each of the objects corresponding to each of the physical locations is maintained in an active memory.

12. The model according to claim 11 wherein the subsequent retrieval of objects corresponding to the physical location of the area query causes the retrieval of all objects associated with the physical location to be retrieved into an active memory.

13. The model according to claim 12 wherein the retrieval of all objects associated with the physical location is from a disk storage.

14. The model according to claim 1 wherein the model allows for insertion of cutlines to frame a particular area of interest.

15. The model according to claim 1 wherein the area query takes place either immediately after synthesis or during final placement and routing.

16. The model according to claim 1 wherein the model is configured to allow for a logical query to take place.

17. The model according to claim 16 wherein the logical query of one object provides at least another object that is logically related to the one object.

* * * * *

EX PARTE REEXAMINATION CERTIFICATE (7007th)

United States Patent
Van Ginneken et al.

(10) Number: US 6,505,328 C1
(45) Certificate Issued: Aug. 18, 2009

(54) METHOD FOR STORING MULTIPLE LEVELS OF DESIGN DATA IN COMMON DATABASE

(75) Inventors: Lukas P. P. P. Van Ginneken, San Jose, CA (US); Patrick R. Groeneveld, San Jose, CA (US); Wilhelmus J. M. Philipsen, Phoenix, AZ (US)

(73) Assignee: Magma Design Automation, Inc., Cupertino, CA (US)

Reexamination Request:
No. 90/008,523, Mar. 9, 2007

Reexamination Certificate for:
Patent No.: 6,505,328
Issued: Jan. 7, 2003
Appl. No.: 09/300,540
Filed: Apr. 27, 1999

(51) Int. Cl.
*G06F 17/50* (2006.01)

(52) U.S. Cl. .................................. 716/7; 716/8; 716/12

(58) Field of Classification Search .................. None
See application file for complete search history.

(56) References Cited

PUBLICATIONS

Rubin, Steven M., Computer Aids for VLSI Design, First Edition, Addison–Wesley Publishing Company, Menlo Park, CA, 1987, 458 pp.

*Primary Examiner*—Minh T Nguyen

(57) ABSTRACT

An automated logic circuit design system uses a common database to store design data at different states of the design process, including data-flow graphs, netlists and layout descriptions. In this way, the need to translate circuit descriptions between tools is eliminated, thus leading to increased speed, flexibility and integration. The common database includes entities, models, cells, pins, busses and nets. The data-flow graphs are stored as graphs, the nodes in a graph as cells, and the edges as busses. Physical design data is available by storing the cells in a model in a KD tree. This allows queries on cells in the netlist located in the layout within arbitrary areas.

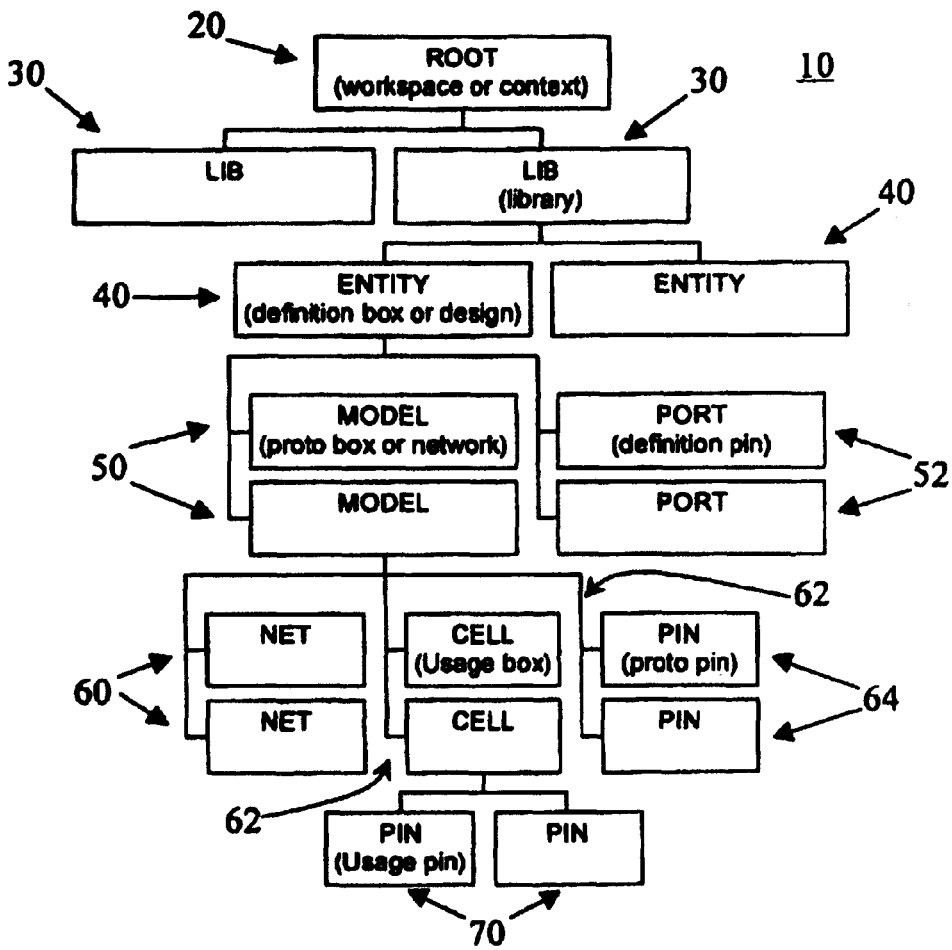

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–17 are cancelled.

\* \* \* \* \*